US010468459B2

(12) United States Patent
Oda et al.

(10) Patent No.: US 10,468,459 B2
(45) Date of Patent: Nov. 5, 2019

(54) MULTIPLE VERTICAL TFT STRUCTURES FOR A VERTICAL BIT LINE ARCHITECTURE

(71) Applicant: SANDISK TECHNOLOGIES LLC, Plano, TX (US)

(72) Inventors: Yusuke Oda, Yokkaichi (JP); Michiaki Sano, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 30 days.

(21) Appl. No.: 15/854,563

(22) Filed: Dec. 26, 2017

(65) Prior Publication Data

US 2019/0198568 A1 Jun. 27, 2019

(51) Int. Cl.

| | |
|---|---|
| ***H01L 27/24*** | (2006.01) |
| ***H01L 45/00*** | (2006.01) |
| *G06F 11/10* | (2006.01) |
| *G11C 13/00* | (2006.01) |
| *G11C 29/52* | (2006.01) |

(52) U.S. Cl.

CPC ........ *H01L 27/249* (2013.01); *H01L 27/2454* (2013.01); *H01L 45/08* (2013.01); *H01L 45/146* (2013.01); *H01L 45/1683* (2013.01); *G06F 11/1068* (2013.01); *G11C 13/004* (2013.01); *G11C 13/0007* (2013.01); *G11C 13/0023* (2013.01); *G11C 13/0038* (2013.01); *G11C 13/0064* (2013.01); *G11C 13/0069* (2013.01); *G11C 29/52* (2013.01)

(58) Field of Classification Search

CPC ... H01L 27/249; H01L 27/2454; H01L 45/08; H01L 45/146; H01L 45/1683; G06F 11/1068; G11C 13/0007; G11C 13/0023; G11C 13/0038; G11C 13/004; G11C 13/0064; G11C 13/0069; G11C 29/52

See application file for complete search history.

(56) References Cited

U.S. PATENT DOCUMENTS

| | | | | |
|---|---|---|---|---|
| 9,105,468 | B2 | 8/2015 | Rabkin | |
| 9,230,985 | B1 | 1/2016 | Wu | |
| 9,373,396 | B2 | 6/2016 | Ratnam | |
| 9,443,910 | B1 * | 9/2016 | Fujiwara | H01L 27/2481 |
| 10,249,682 | B2 * | 4/2019 | Franca-Neto | H01L 27/2481 |
| 2012/0147648 | A1 | 6/2012 | Scheuerlein | |

(Continued)

*Primary Examiner* — Peter Bradford

(74) *Attorney, Agent, or Firm* — Vierra Magen Marcus LLP

(57) ABSTRACT

Systems and methods for implementing a memory array comprising vertical bit lines that are connected to different pairs of vertical thin-film transistors (TFTs) are described. A set of vertical TFTs may be formed such that a first TFT and a second TFT are spaced apart by a first separation distance and a third TFT and the second TFT are spaced apart by a second separation distance. The fabrication of the memory array includes forming a layer of conducting material with a thickness that is greater than half of the first separation distance and less than half of the second separation distance and then performing an anisotropic etch to remove portions of the conducting material such that openings in the conducting material are formed between the pairs of vertical TFTs while preventing openings from forming between the vertical TFTs of each pair of vertical TFTs.

19 Claims, 13 Drawing Sheets

(56) References Cited

U.S. PATENT DOCUMENTS

2014/0252454 A1* 9/2014 Rabkin ................. H01L 27/249 257/329
2014/0254256 A1* 9/2014 Choi .................. H01L 45/1206 365/163
2015/0091081 A1* 4/2015 Suh ..................... H01L 29/7827 257/329

* cited by examiner

MULTIPLE VERTICAL TFT STRUCTURES FOR A VERTICAL BIT LINE ARCHITECTURE

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in transistor characteristics and memory element characteristics over process, voltage, and temperature variations.

DETAILED DESCRIPTION

Figure 1A:
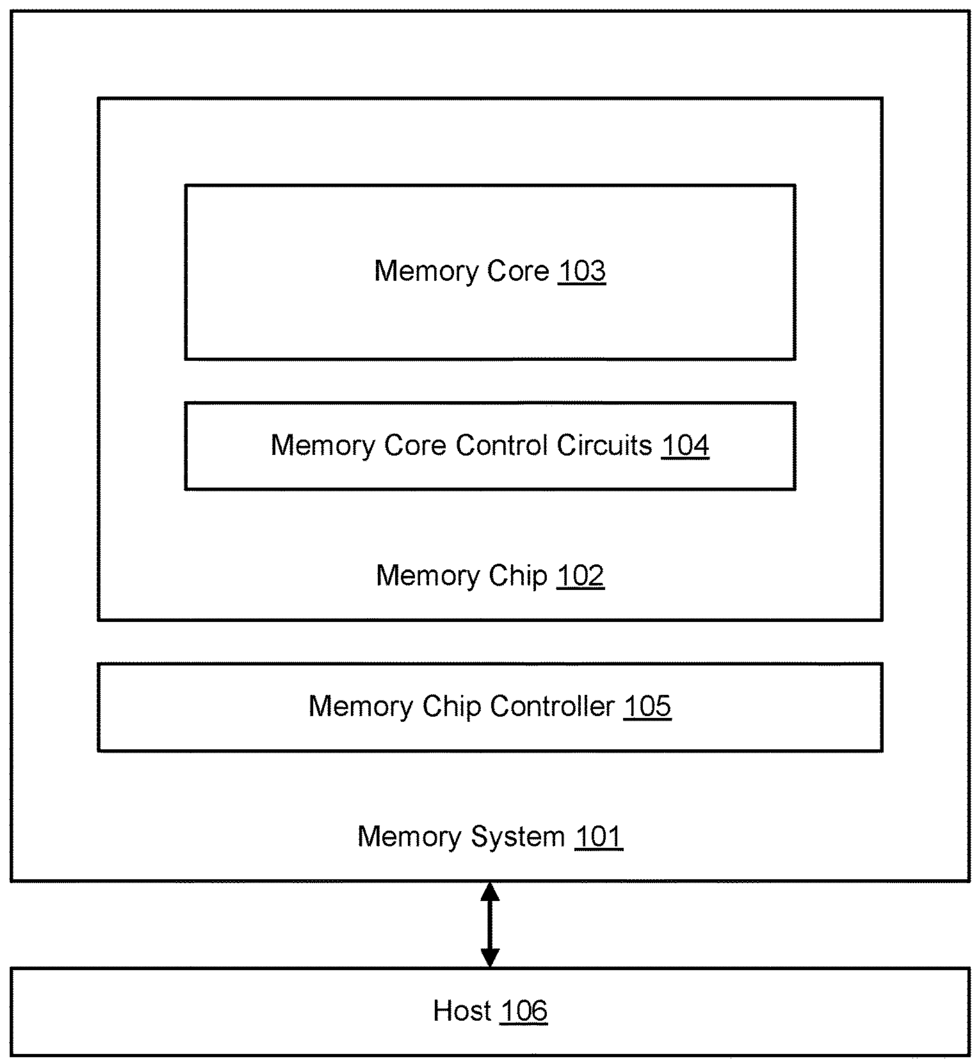
FIGS. 1A-1E depict various embodiments of a memory system.

Technology is described for implementing a memory array comprising vertical bit lines that are each connected to a different pair of vertical thin-film transistors (TFTs). The vertical bit lines may comprise bit lines that are arranged orthogonally to a substrate. A vertical bit line may connect to a plurality of memory cells and each memory cell of the plurality of memory cells may connect to a different word line of a plurality of word lines within the memory array. In some cases, a set of vertical TFTs may be formed such that a first TFT and a second TFT of the set of vertical TFTs are separated or spaced apart by a first separation distance (e.g., 8 nm) and a third TFT of the set of vertical TFTs and the second TFT are separated or spaced apart by a second separation distance (e.g., 12 nm) greater than the first separation distance. The first TFT and the second TFT may correspond with a first pair of vertical TFTs that are connected to a first vertical bit line and the third TFT and a fourth TFT of the set of vertical TFTs may correspond with a second pair of vertical TFTs that are connected to a second vertical bit line. Each pair of vertical TFTs may be have a tighter spacing between the pair of vertical TFTs than between one of the pair of vertical TFTs and an adjacent vertical TFT corresponding with an adjacent pair of vertical TFTs.

During fabrication of the memory array, the pairs of vertical TFTs may be electrically and physically connected to a corresponding vertical bit line by forming a layer of conducting material (e.g., a conformal layer of titanium nitride) with a thickness that is greater than half of the first separation distance (e.g., greater than 4 nm) and less than half of the second separation distance (e.g., less than 6 nm) and then performing an anisotropic etch to remove portions of the conducting material by at least the thickness of the layer of conducting material deposited in order to form openings between the pairs of vertical TFTs while preventing openings from forming between the vertical TFTs of each pair of vertical TFTs. One benefit of connecting each vertical bit line in the memory array to a pair of vertical TFTs is that the control of on/off currents for the pair of vertical TFTs (e.g., comprising select transistors for the vertical bit lines) may be improved. Another benefit of altering the pitch for the vertical TFTs arranged below memory cells of the memory array is that the cost of fabricating the memory array may be reduced by omitting or reducing the number of photolithographic steps required to fabricate the memory array.

A non-volatile memory array may comprise a two-dimensional array of non-volatile memory cells. The memory cells within a two-dimensional memory array may form a single layer of memory cells and may be selected via control lines (e.g., word lines and bit lines) in the X and Y directions. The non-volatile memory array may comprise a monolithic three-dimensional memory array in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element with or without an isolation element in series with the reversible resistance-switching element (e.g., no diode in series with the reversible resistance-switching element). The memory cells within the memory array may comprise ReRAM memory cells, MRAM memory cells, or phase change memory cells.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In some embodiments, a memory cell may be formed using a Vacancy Modulated Conductive Oxide (VMCO) structure. The VMCO structure may include a layer of amorphous silicon (e.g., a Si barrier layer) and a layer titanium oxide (e.g., a TiO2 switching layer). In some cases, the VMCO structure (or VMCO stack) may use bulk switching or switching O-ion movements across an area of the VMCO structure, as compared with switching locally in a constriction of vacancy formed filamentary path. In some embodiments, VMCO structures may be partially or fully embedded within word line layers of a memory array, such as a memory array arranged using a vertical bit line (VBL) architecture (e.g., a memory array architecture in which memory cells are arranged between horizontal word lines and vertical bit lines that are orthogonal to a substrate). A VMCO structure may be partially or fully formed within a word line layer of a memory array. A VMCO stack may comprise a layer of amorphous silicon and a layer titanium oxide. In some cases, the VMCO stack may comprise a layer of thin aluminum oxide or other metal oxides arranged between the layer of amorphous silicon and the layer titanium oxide.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
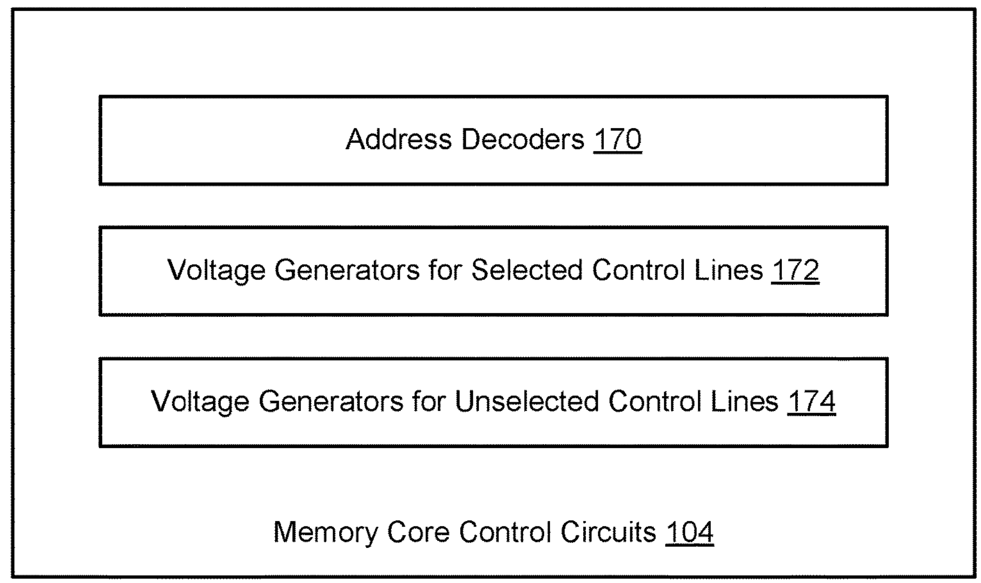

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
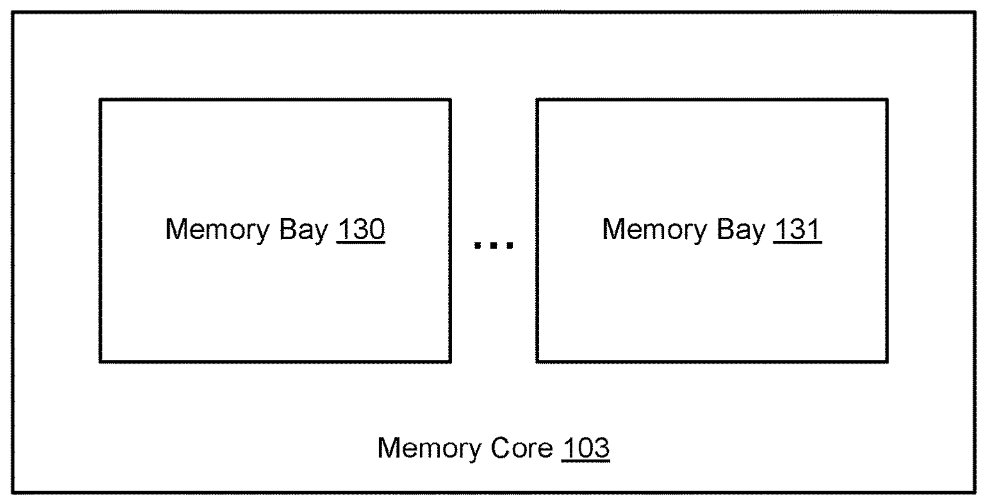
Figure 1D:
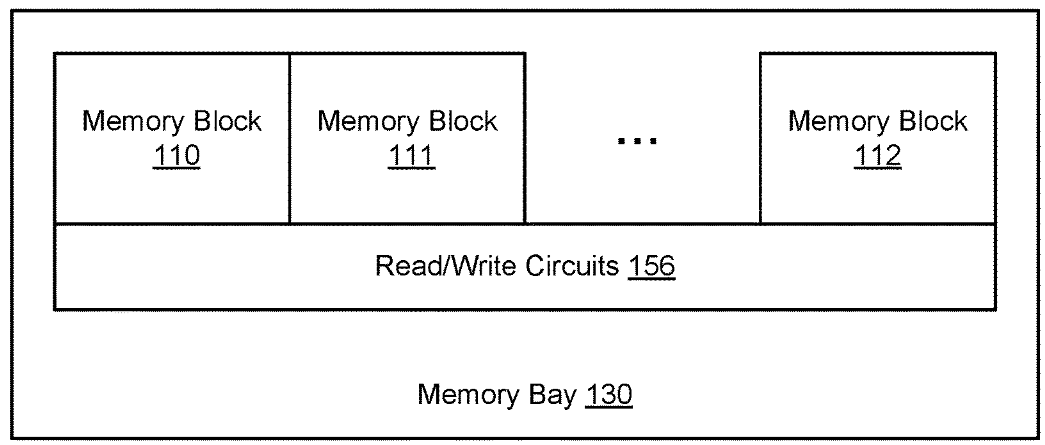
Figure 1E:
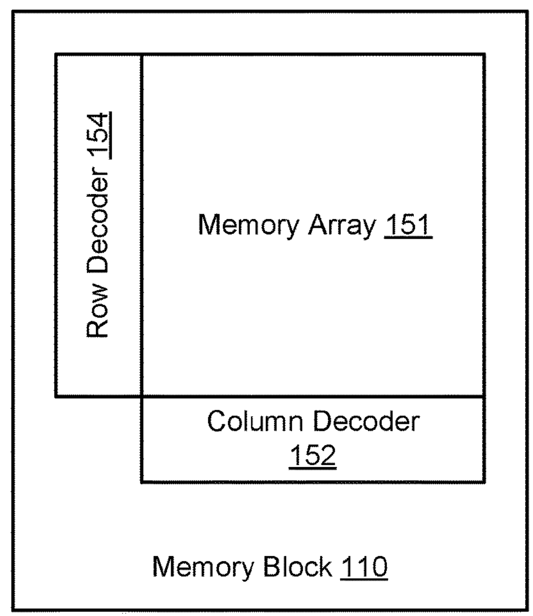

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a “0” state, or needs to be reset to a “1” state. The memory system 101 may then write a first subset of the memory cells to the “0” state and then write a second subset of the memory cells to the “1” state. The memory cells that are already at the correct state may be skipped over, thereby improving programming speed and reducing the cumulative voltage stress applied to unselected memory cells. A particular memory cell may be set to the “1” state by applying a first voltage difference across the particular memory cell of a first polarity (e.g., +1.5V). The particular memory cell may be reset to the “0” state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
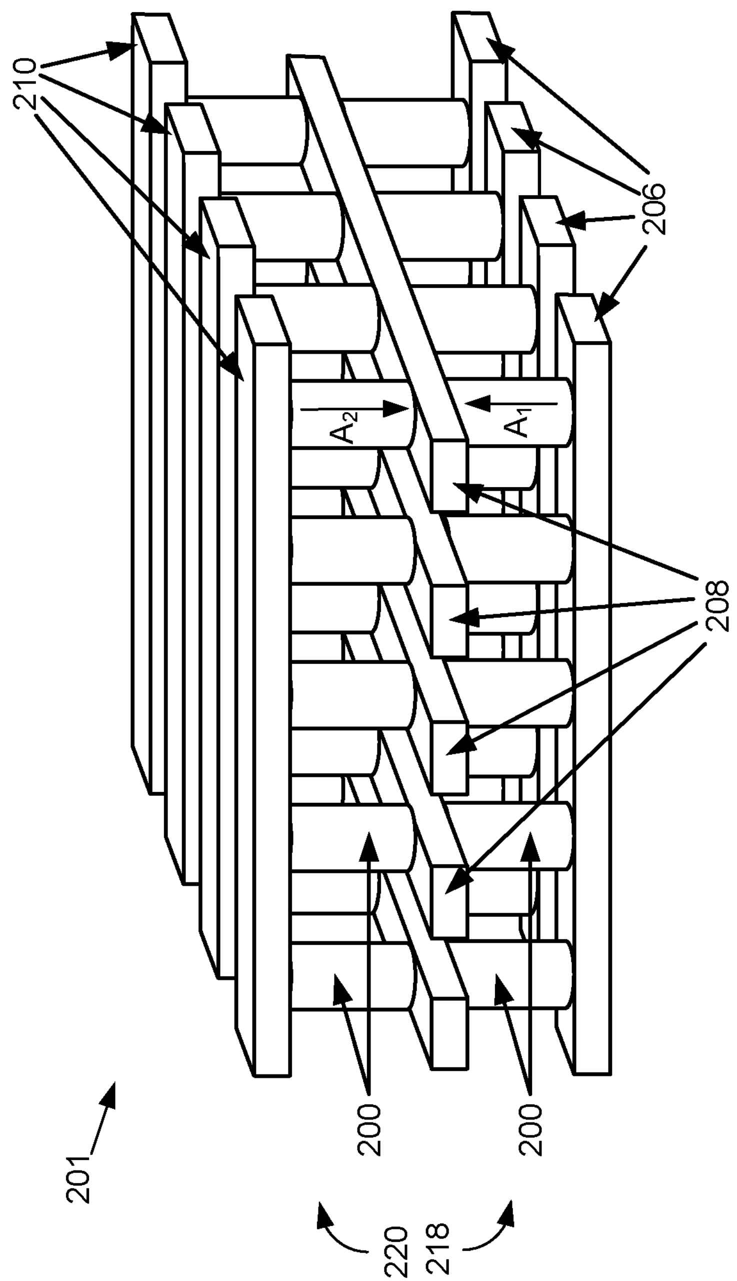
FIGS. 2A-2B depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
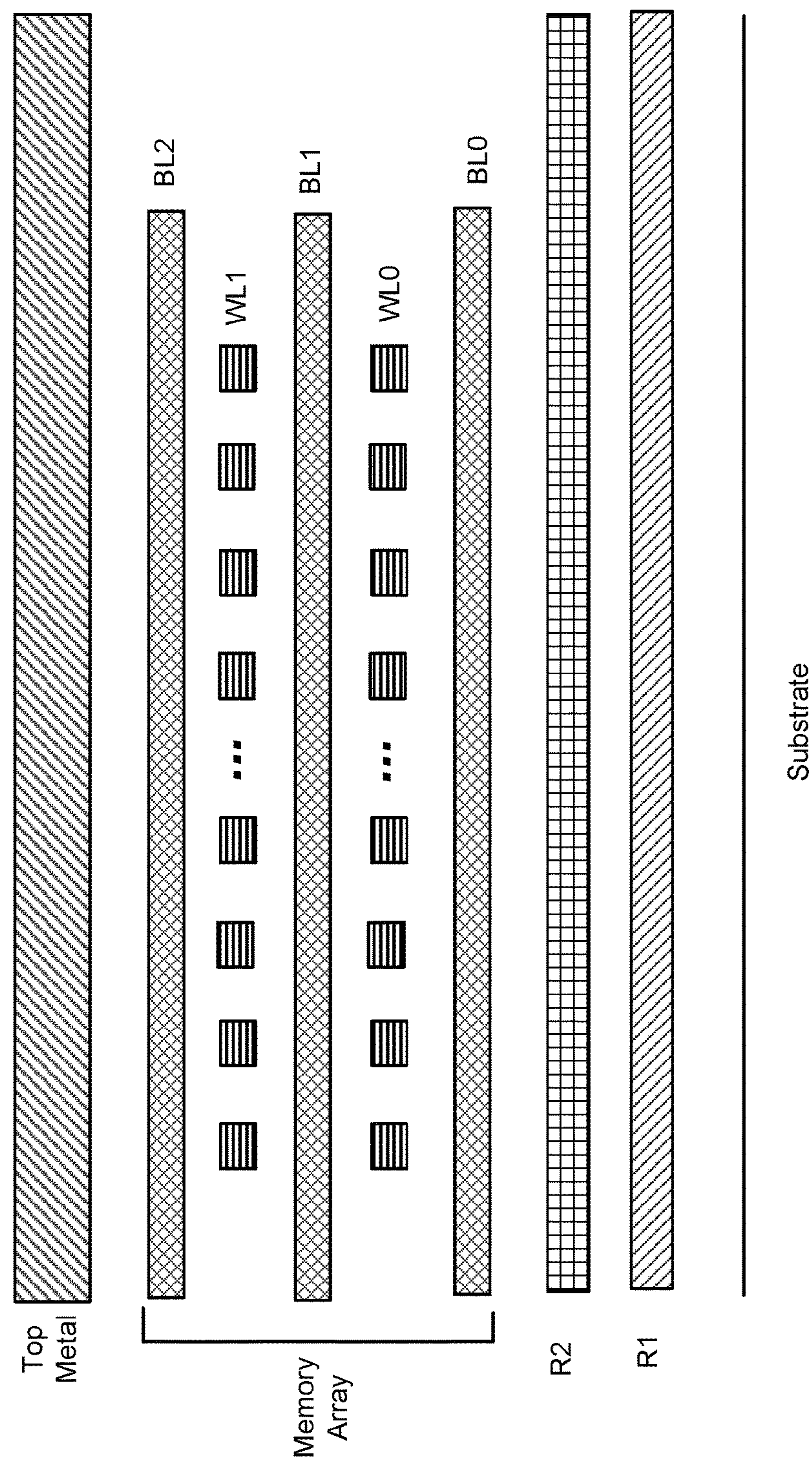

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
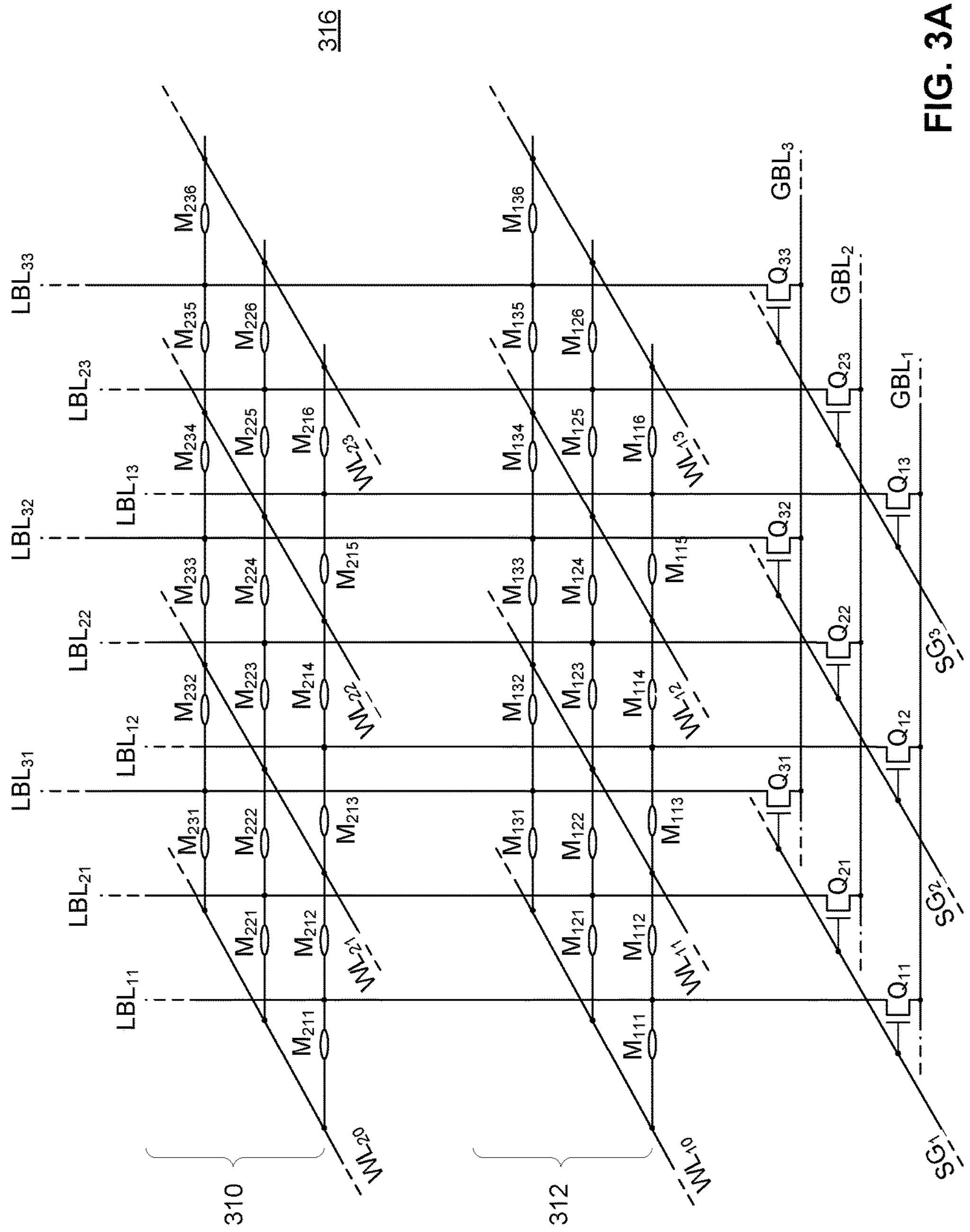
FIGS. 3A-3B depict various embodiments of a portion of a three-dimensional memory array.

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
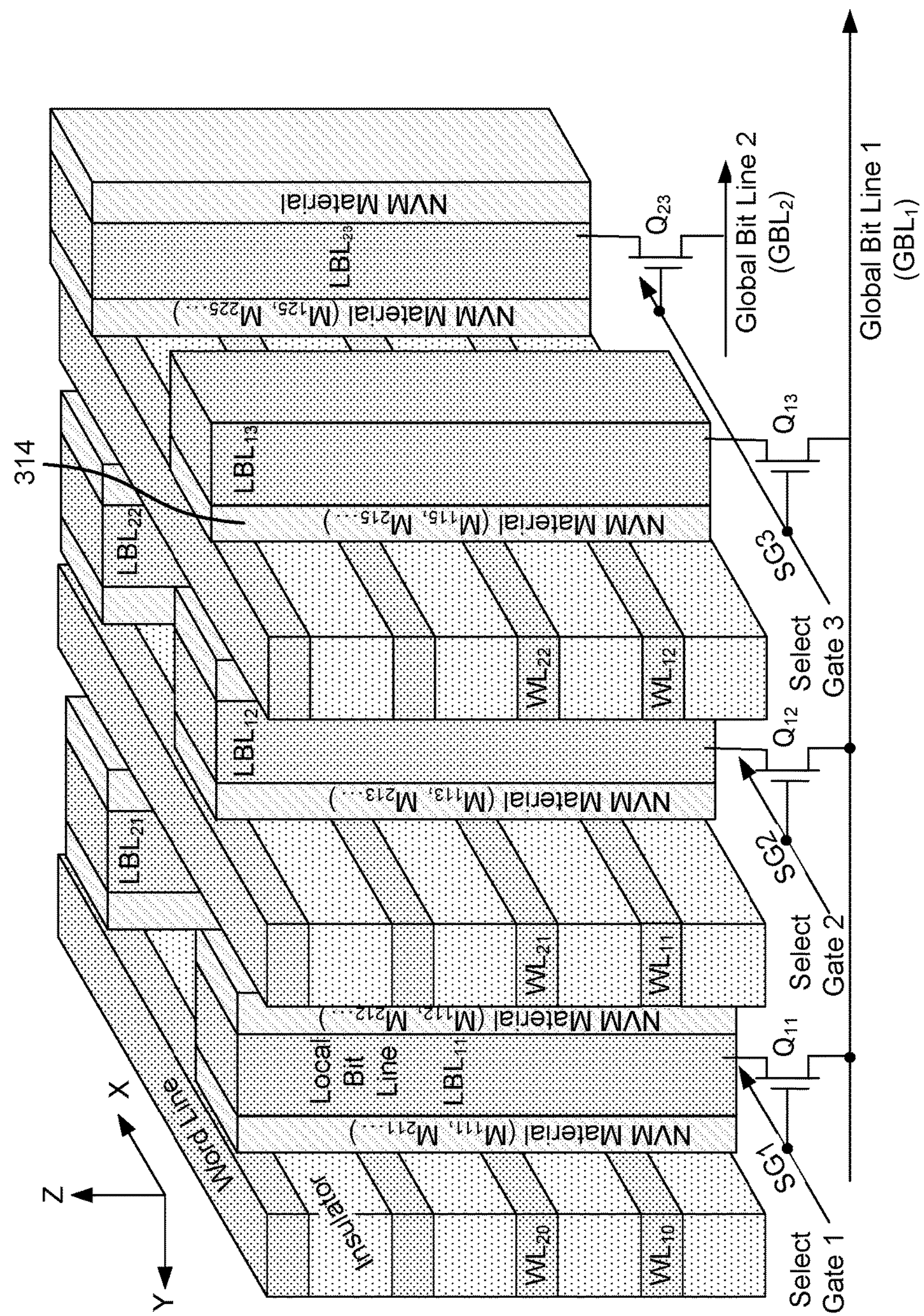

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$.

In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 4:
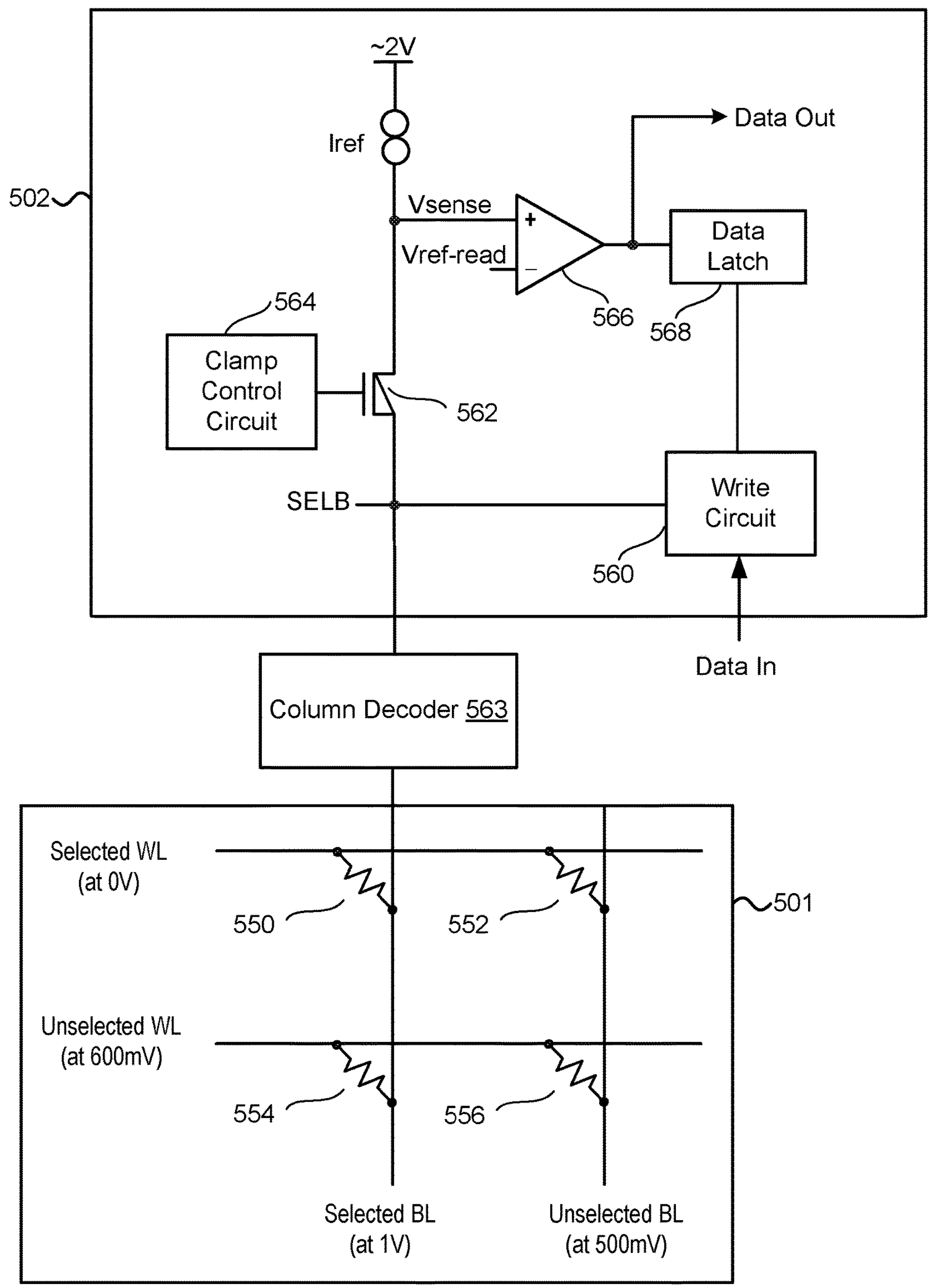
FIG. 4 depicts one embodiment of a read/write circuit.

FIG. 4 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 4 may be reversed such that the selected bit line is biased to 0V, the unselected word line is biased to 0.4V, the selected word line is biased to 1V, and the unselected bit line is biased to 0.5V.

As depicted in FIG. 4, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage).

When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 5A:
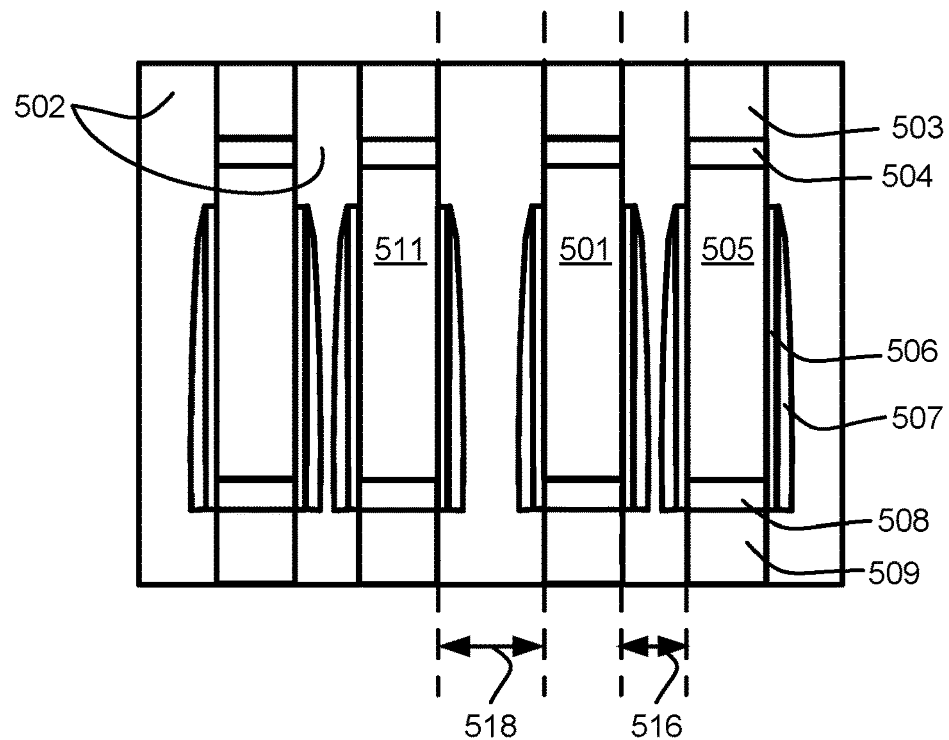
FIGS. 5A-5F depict various stages of fabrication using cross-sectional views and may be referred to when describing the processes of FIGS. 6A-6B.
Figure 5B:
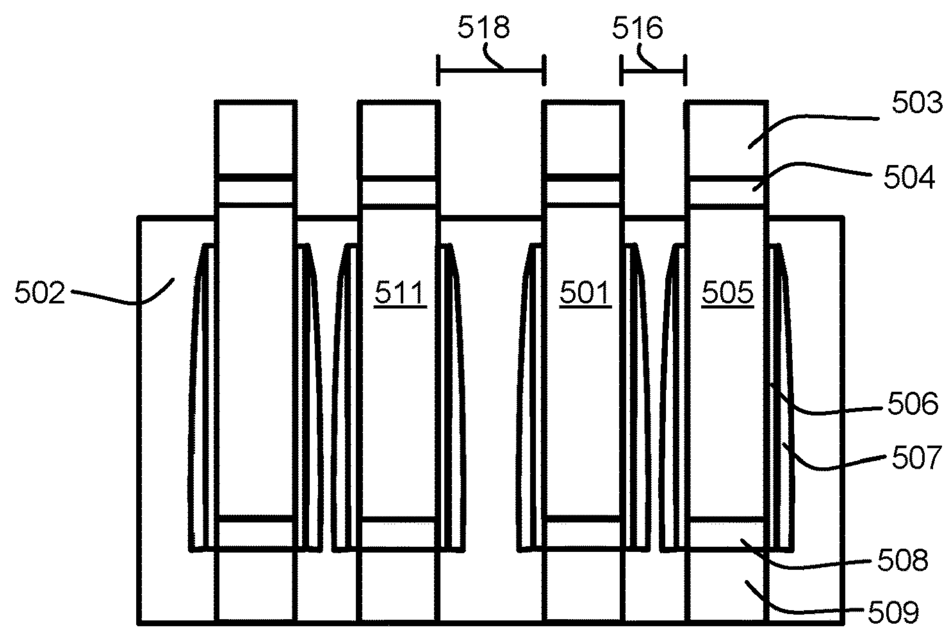
Figure 5C:
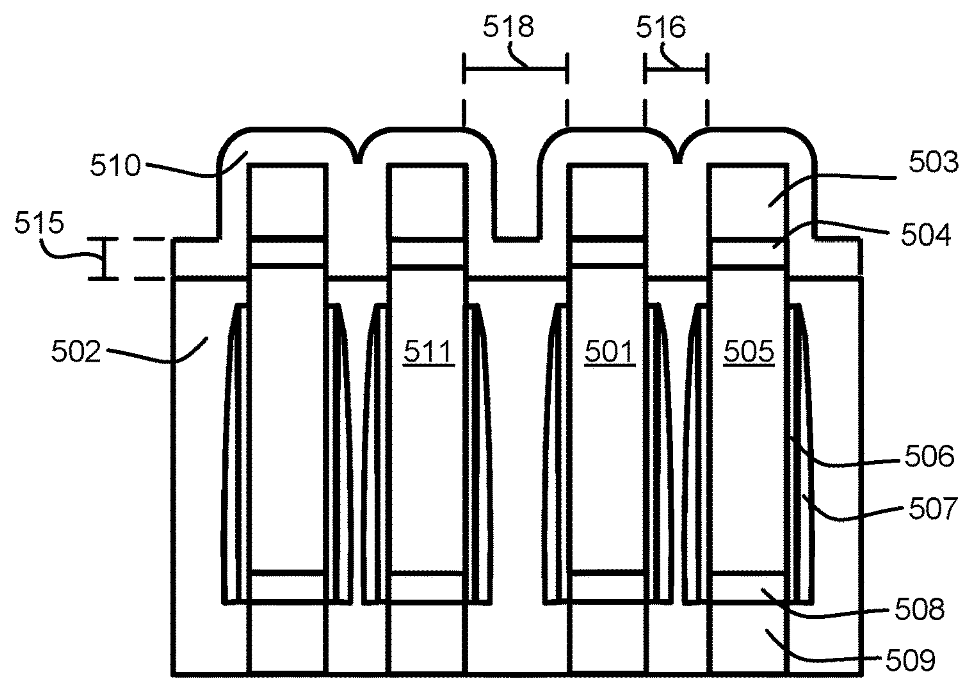
Figure 5D:
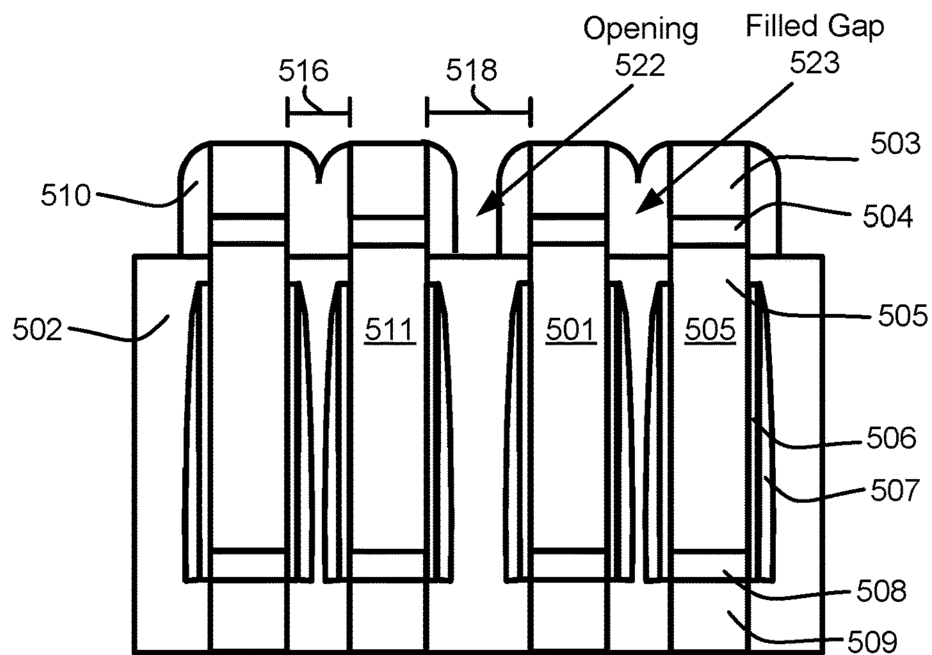
Figure 5F:
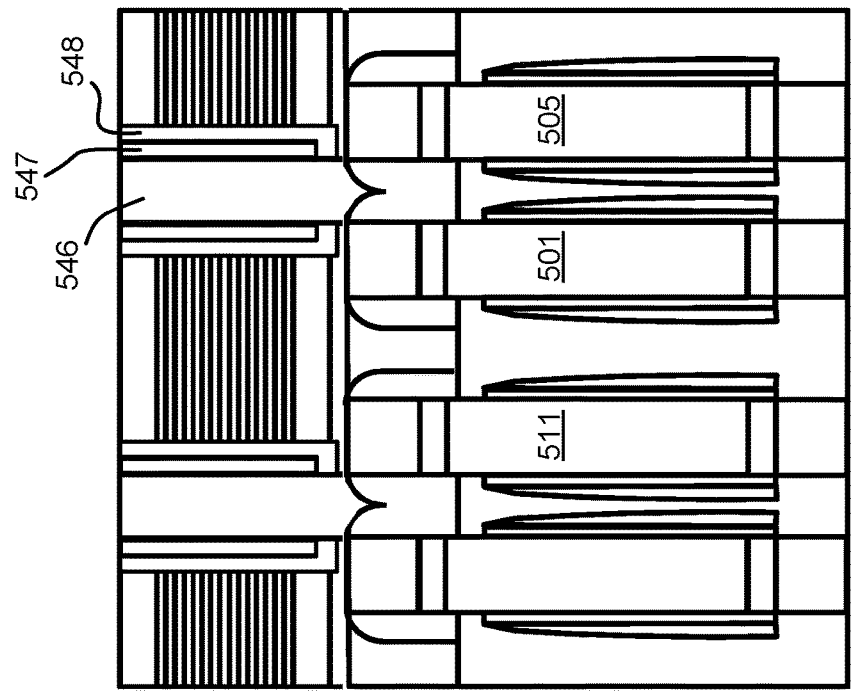
Figure 5E:
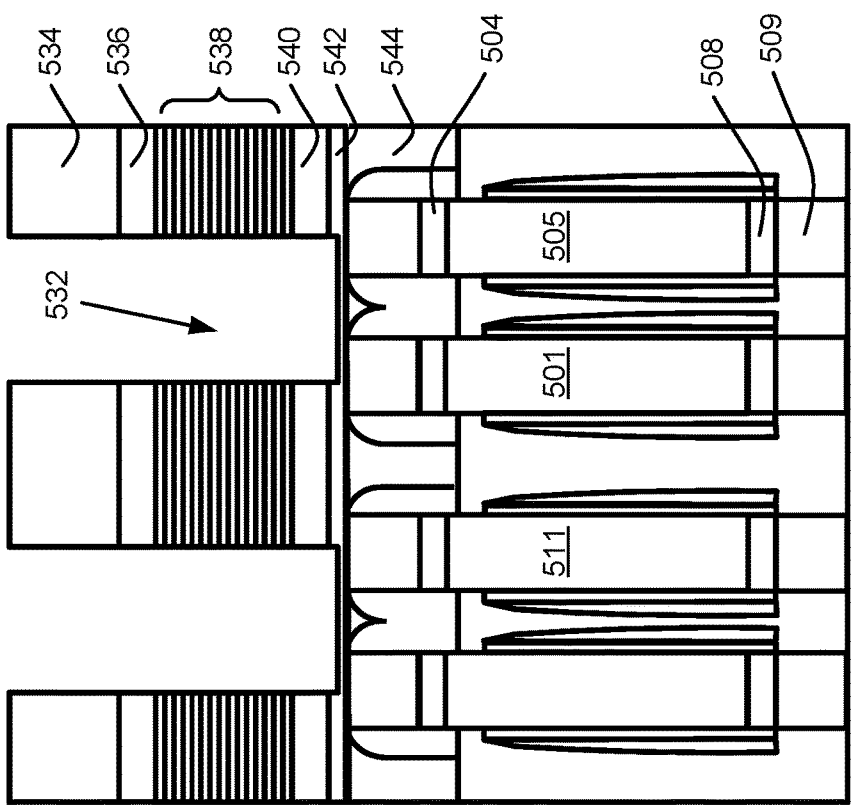
Figure 6A:
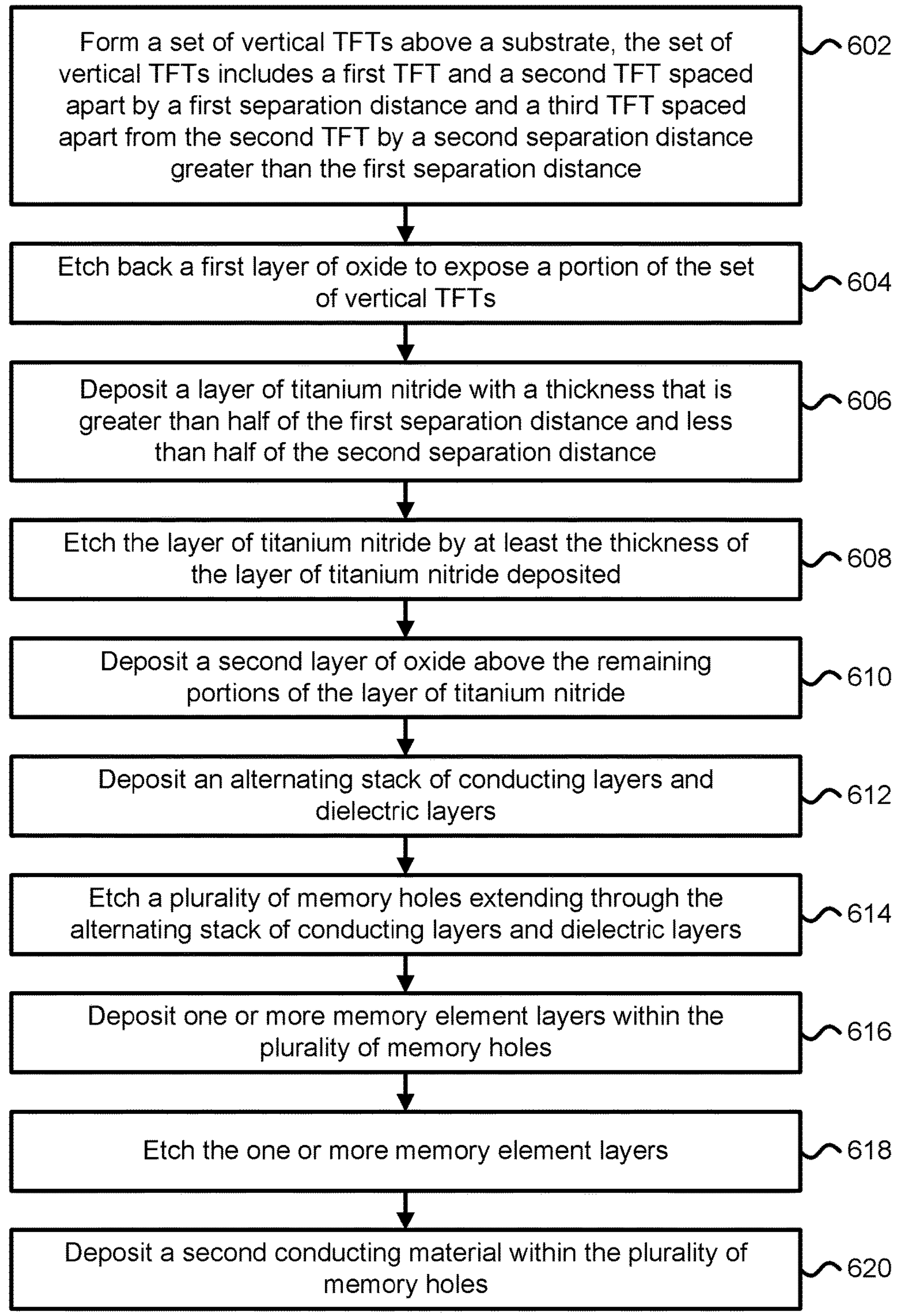
FIG. 6A depicts a flowchart describing one embodiment of a process for forming a memory structure with vertical bit lines.
Figure 6B:
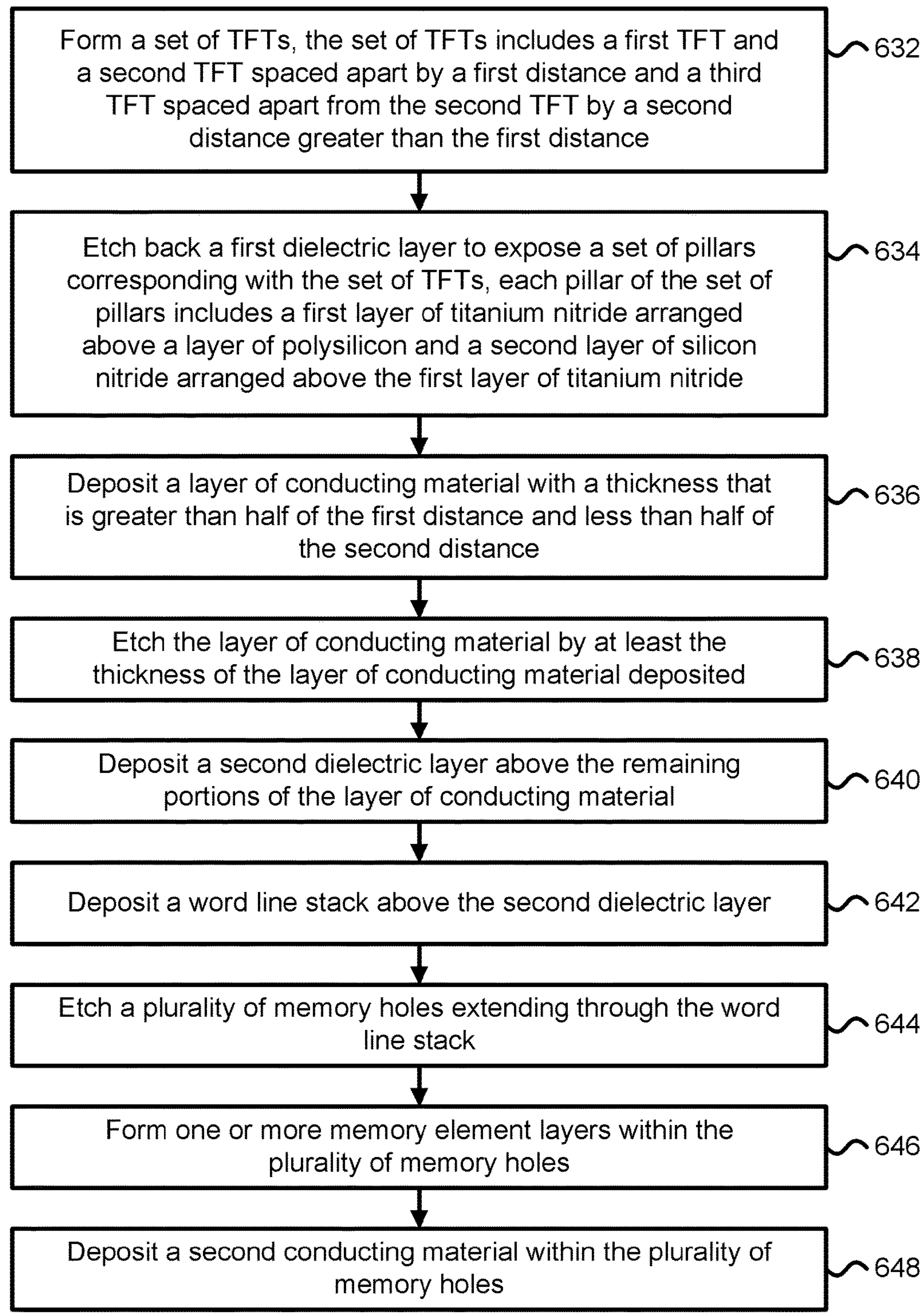
FIG. 6B depicts a flowchart describing an alternative embodiment of a process for forming a memory structure with vertical bit lines.

FIGS. 6A-6B depict various embodiments of processes for forming a memory structure with vertical bit lines. FIGS. 5A-5F depict various stages of fabrication using cross-sectional views and may be referred to when describing the processes of FIGS. 6A-6B.

FIG. 6A depicts a flowchart describing one embodiment of a process or portion thereof for forming a memory structure with vertical bit lines. The flowchart may omit common processing steps (e.g., the formation of isolation regions or structures, various implant and annealing steps, the formation of vias/contacts, the formation of a passivation layer, planarization, etc.) in order to highlight the processing steps described.

In step 602, a set of vertical TFTs is formed above a substrate. The substrate may comprise a silicon substrate. The set of vertical TFTs may include a first TFT and a second TFT that are spaced apart by a first separation distance. The first TFT and the second TFT may comprise a first pair of vertical TFTs. The first separation distance may comprise a physical separation between a first polysilicon region corresponding with the first TFT and a second polysilicon region corresponding with the second TFT. The first TFT may correspond with a first TFT pillar and the second TFT may correspond with a second TFT pillar. In this case, the first separation distance may comprise the minimum distance between the first TFT pillar and the second TFT pillar. The set of vertical TFTs may also include a third TFT that is spaced apart from the second TFT by a second separation distance that is greater than the first separation distance. In one example, the first separation distance may comprise 8 nm and the second separation distance may comprise 12 nm.

Referring to FIG. 5A, a set of vertical TFTs (e.g., four vertical TFTs) have been formed above a substrate. A first vertical TFT of the set of vertical TFTs comprises a first pillar structure with a layer of silicon nitride 503 arranged above a layer of titanium nitride 504 arranged above a layer of polysilicon 505 (e.g., intrinsic or undoped polysilicon) arranged above a layer of titanium nitride 508 arranged above a layer of tungsten 509. A gate oxide material 506 (e.g., silicon dioxide) and a gate material 507 (e.g., polysilicon) may surround the first pillar structure. A voltage applied to a gate corresponding with the gate material 507 of the first vertical TFT may set the first vertical TFT into a conducting state or a non-conducting state. An oxide layer 502 (e.g., silicon dioxide) may electrically insulate the set of vertical TFTs from each other. A second vertical TFT of the set of vertical TFTs comprises a second pillar structure similar to the first pillar structure. The second pillar structure includes a layer of polysilicon 501. A first separation distance 516 between the layer of polysilicon 501 and the layer of polysilicon 505 may be less than a second separation distance 518 between the layer of polysilicon 501 and a layer of polysilicon 511 of a third pillar structure corresponding with a third vertical TFT. In some cases, the first separation distance may correspond with the spacing between the first pillar structure and the second pillar structure and the second separation distance may correspond with the spacing between the second pillar structure and the third pillar structure. In other cases, the first separation distance may correspond with a first spacing between a first vertical TFT and a second vertical TFT of a first pair of vertical TFTs and the second separation distance may correspond with a second spacing between the second vertical TFT and a third vertical TFT of a second pair of vertical TFTs.

Referring to FIG. 6A, in step 604, a first layer of oxide is etched back to expose a portion of the set of vertical TFTs. Referring to FIG. 5B, the oxide layer 502 has been etched back to expose the layer of silicon nitride 503 and the layer of titanium nitride 504. In some cases, the oxide layer may also be etched back to expose a top portion of the layer of polysilicon 505. The etching process may comprise a timed etch. The etching process may be performed using various etching techniques such as dry etching, wet chemical etching, plasma etching, or reactive-ion etching (RIE). In step 606, a layer of titanium nitride with a thickness that is greater than half of the first separation distance and less than half of the second separation distance is deposited. The layer of titanium nitride may be conformally deposited using various deposition techniques such as chemical vapor deposition (CVD), physical vapor deposition (PVD), or atomic layer deposition (ALD). Referring to FIG. 5C, a layer of titanium nitride 510 with a thickness 515 has been conformally deposited above the oxide layer 502 with a thickness (e.g., 5 nm) that is greater than half of the first separation distance (e.g., 4 nm) and less than half of the second separation distance (e.g., 6 nm). The layer of titanium nitride 510 may be deposited such that the deposited layer directly contacts drain-side portions of the set of vertical TFTs or a conducting material in contact with the drain-side portions, such as the layer of titanium nitride 504 in FIG. 5C. The layers of titanium nitride in contact with the drain-side portions of the set of vertical TFTs may correspond with top electrodes for the set of vertical TFTs.

In step 608, the layer of titanium nitride is etched or removed by at least the thickness of the layer of titanium nitride deposited in step 606. The layer of titanium nitride may be etched or removed in the vertical direction by at least the thickness of the layer of titanium nitride deposited. The etching of the layer of titanium nitride may be performed using an anisotropic etch to remove portions of the layer of titanium nitride by at least the thickness of the layer of titanium nitride in a vertical direction in order to form openings between the second TFT and the third TFT while preventing openings from forming between the second TFT and the first TFT. The anisotropic etch may provide orientation dependent etching such that material is removed uniformly in a vertical direction and is substantially not removed in a horizontal direction. Referring to FIG. 5D, an opening 522 has been formed between the second TFT and the third TFT while a portion of the layer of titanium nitride still fills the gap 523 between the second TFT and the first TFT. The existence of the portion of the layer of titanium nitride between the layer of titanium nitride 504 and the corresponding layer of titanium nitride associated with the second TFT may form an electrical short between the drain-side ends of the first TFT and the second TFT.

In step 610, a second layer of oxide (or a dielectric material) is deposited above the remaining portions of the layer of titanium nitride. After the second layer of oxide has been deposited, a CMP step may be performed to planarize the resulting surface with a silicon nitride layer, such as the layer of silicon nitride 503, acting as a CMP stopper layer. Referring to FIG. 5E, the second layer of oxide may correspond with oxide layer 544. In step 612, an alternating stack of conducting layers and dielectric layers is deposited. The alternating stack of conducting layers and dielectric layers may correspond with a multi-layer word line stack with the conducting layers corresponding with different word line layers. The alternating stack of conducting layers and dielectric layers may comprise layers of titanium nitride or polysilicon that are separated by oxide layers. In step 614, a plurality of memory holes extending through the alternating stack of conducting layers and dielectric layers is etched. The plurality of memory holes may comprise rectangular, square, or cylindrical holes. The memory hole etch may be performed using various etching techniques such as dry etching, wet chemical etching, plasma etching, or reactive-ion etching (RIE). Referring to FIG. 5E, a memory hole 532 has been etched extending through oxide layer 536, an alternating stack of conducting layers and dielectric layers 538, and dielectric layer 540. The memory hole 532 extends through a portion of the layer 542 (e.g., an etch stop layer). A hardmask layer 534 may be used to assist with the patterning and etching of the plurality of memory holes. In some cases, the selective removal of material may be performed using a lithographic sequence including depositing a layer of photoresist (positive or negative) over a material, exposing the layer of photoresist to light via a mask (i.e., the mask determines which areas of the layer of photoresist are exposed to the light), and then selectively etching the material based on the exposed portions of the layer of photoresist.

In step 616, one or more memory element layers are deposited within the plurality of memory holes. The one or more memory element layers may be deposited using various deposition techniques such as chemical vapor deposition (CVD), physical vapor deposition (PVD), or atomic layer deposition. In step 618, the one or more memory element layers are etched. In step 620, a second conducting material is deposited within the plurality of memory holes. Referring to FIG. 5F, a memory element layer 548 has been deposited within the memory hole 532 along with a layer of titanium nitride 547 and a tungsten layer 546. The memory element layer 548 may comprise a metal oxide layer (e.g., nickel oxide or hafnium oxide). The memory element layer 548 may comprise a ReRAM material. In some embodiments, the one or more memory element layers may correspond with a VMCO structure, which may include a layer of amorphous silicon and a layer titanium oxide. In other embodiments, the one or more memory element layers may include a phase change material. As depicted in FIG. 5F, the tungsten layer 546 may correspond with a first vertical bit line that connects to a first pair of vertical TFTs corresponding with polysilicon layers 501 and 505.

FIG. 6B depicts a flowchart describing an alternative embodiment of a process or portion thereof for forming a memory structure with vertical bit lines. The flowchart may omit common processing steps (e.g., the formation of isolation regions or structures, various implant and annealing steps, the formation of vias/contacts, the formation of a passivation layer, planarization, etc.) in order to highlight the processing steps described.

In step 632, a set of TFTs is formed. The set of TFTs may be formed above a silicon substrate. The set of TFTs may include a first TFT and a second TFT that are spaced apart by a first distance and a third TFT spaced apart from the second TFT by a second distance greater than the first distance. Referring to FIG. 5A, the first distance may correspond with the first separation distance 516 and the second distance may correspond with the second separation distance 518. In step 634, a first dielectric layer is etched back to expose a set of pillars corresponding with the set of TFTs. Each pillar of the set of pillars may include a first layer of titanium nitride arranged above a layer of polysilicon and a second layer of silicon nitride arranged above the first layer of titanium nitride. Referring to FIG. 5B, the first dielectric layer may correspond with the oxide layer 502 and a first exposed pillar corresponding with a first vertical TFT may correspond with silicon nitride layer 503 arranged above the titanium nitride layer 504 arranged above the layer of polysilicon 505.

In step 636, a layer of conducting material with a thickness that is greater than half of the first distance and less than half of the second distance is deposited. The layer of conducting material may correspond with the layer of titanium nitride 510 with thickness 515 in FIG. 5C. In step 638, the layer of conducting material is etched in the vertical direction by at least the thickness of the layer of conducting material deposited in step 636. The etching of the layer of conducting material may be performed using an anisotropic etch to remove portions of the layer of conducting material by at least the thickness of the layer of conducting material in a vertical direction in order to form openings between the second TFT and a third TFT while preventing openings from forming between the second TFT and the first TFT. Referring to FIG. 5D, an opening 522 has been formed between the second TFT and the third TFT while a portion of the layer of titanium nitride still fills the gap 523 between the second TFT and the first TFT.

In step 640, a second dielectric layer is deposited above the remaining portions of the layer of conducting material. In step 642, a word line stack is deposited above the second dielectric layer. The word line stack may comprise layers of titanium nitride or polysilicon that are separated by oxide layers. In step 644, a plurality of memory holes extending through the word line stack is etched. In step 646, one or more memory element layers are formed within the plurality of memory holes. The one or more memory element layers may be deposited using various deposition techniques such as chemical vapor deposition (CVD), physical vapor deposition (PVD), or atomic layer deposition. In step 648, a second conducting material is deposited within the plurality of memory holes. Referring to FIG. 5F, a memory element layer 548 has been deposited within the memory hole 532 along with a layer of titanium nitride 547 and a tungsten layer 546. The memory element layer 548 may comprise a metal oxide layer (e.g., nickel oxide or hafnium oxide) or a ReRAM material. In some embodiments, the one or more memory element layers may correspond with a VMCO structure, which may include a layer of amorphous silicon and a layer titanium oxide. In other embodiments, the one or more memory element layers may include a phase change material.

One embodiment of the disclosed technology includes forming a set of TFTs above a substrate. The set of TFTs includes a first TFT and a second TFT separated by a first separation distance and a third TFT separated from the second TFT by a second separation distance greater than the first separation distance. The method further comprises etching back a first dielectric layer to expose a set of pillars corresponding with the set of TFTs. Each pillar of the set of pillars includes a first layer of titanium nitride and a second layer silicon nitride. The method further comprises depositing a layer of conducting material with a thickness that is greater than half of the first separation distance and less than half the second separation distance, etching the layer of conducting material by at least the thickness in a vertical direction orthogonal to the substrate, depositing a word line stack above the set of TFTs, etching a plurality of memory holes extending through the word line stack, forming one or more memory element layers within the plurality of memory holes, and depositing a second conducting material within the plurality of memory holes.

One embodiment of the disclosed technology includes forming a set of vertical TFTs above a substrate. The set of vertical TFTs includes a first TFT and a second TFT spaced apart by a first separation distance. The set of vertical TFTs includes a third TFT spaced apart from the second TFT by a second separation distance greater than the first separation distance. The method further comprises etching back a first layer of oxide to expose a portion of the set of vertical TFTs, depositing a layer of titanium nitride with a thickness that is greater than half of the first separation distance and less than half of the second separation distance, etching the layer of titanium nitride by at least the thickness in a vertical direction orthogonal to the substrate, depositing an alternating stack of conducting layers and dielectric layers above the set of vertical TFTs, etching a plurality of memory holes extending through the alternating stack of conducting layers and dielectric layers, depositing one or more memory element layers within the plurality of memory holes, and depositing a second conducting material within the plurality of memory holes.

One embodiment of the disclosed technology includes a first set of memory cells, a second set of memory cells, a set of vertical TFTs arranged above a substrate, a first vertical bit line, and a second vertical bit line. The set of vertical TFTs includes a first TFT and a second TFT separated by a first separation distance in a horizontal dimension and a third TFT separated from the second TFT by a second separation distance greater than the first separation distance in the horizontal dimension. The set of vertical TFTs includes a fourth TFT separated from the third TFT by the first separation distance in the horizontal dimension. The first vertical bit line connected to the first set of memory cells. The first vertical bit line connected to a first layer of titanium nitride that electrically shorts a drain-side end of the first TFT with a drain-side end of the second TFT. The second vertical bit line connected to the second set of memory cells. The second vertical bit line connected to a second layer of titanium nitride that electrically shorts a drain-side end of the third TFT with a drain-side end of the fourth TFT.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for fabricating a non-volatile memory, comprising:

forming a set of TFTs above a substrate, the set of TFTs includes a first TFT and a second TFT separated by a first separation distance and a third TFT separated from the second TFT by a second separation distance greater than the first separation distance;

etching back a first dielectric layer to expose a set of pillars corresponding with the set of TFTs, each pillar of the set of pillars includes a first layer of titanium nitride and a second layer silicon nitride;

depositing a layer of conducting material with a thickness that is greater than half of the first separation distance and less than half the second separation distance;

etching the layer of conducting material by at least the thickness in a vertical direction orthogonal to the substrate;

depositing a word line stack above the set of TFTs;

etching a plurality of memory holes extending through the word line stack;

forming one or more memory element layers within the plurality of memory holes; and depositing a second conducting material within the plurality of memory holes.

2. The method of claim 1, wherein:

a first pillar of the set of pillars corresponds with the first TFT and a second pillar of the set of pillars corresponds with the second TFT, the first separation distance comprises a distance between the first pillar and the second pillar.

3. The method of claim 1, wherein:

the set of TFTs includes a fourth TFT that is separated from the third TFT by the first separation distance.

4. The method of claim 1, wherein:

the etching the layer of conducting material by at least the thickness in the vertical direction comprises performing an anisotropic etch.

5. The method of claim 1, wherein:

the word line stack comprises an alternating stack of conducting layers and dielectric layers.

6. The method of claim 1, wherein:

the word line stack comprises an alternating stack of polysilicon layers and oxide layers.

7. The method of claim 1, wherein:

the second conducting material comprises tungsten.

8. The method of claim 1, wherein:

the one or more memory element layers includes a layer of titanium oxide.

9. The method of claim 1, wherein:

the one or more memory element layers includes at least one ReRAM material.

10. The method of claim 1, wherein:

the layer of conducting material comprises a layer of titanium nitride.

11. The method of claim 1, wherein:

the first dielectric layer comprises a first layer of silicon dioxide; and the set of pillars are arranged orthogonal to the substrate.

12. A method for fabricating a non-volatile memory, comprising:

forming a set of vertical TFTs above a substrate, the set of vertical TFTs includes a first TFT and a second TFT spaced apart by a first separation distance, the set of vertical TFTs includes a third TFT spaced apart from the second TFT by a second separation distance greater than the first separation distance;

etching back a first layer of oxide to expose a portion of the set of vertical TFTs;

depositing a layer of titanium nitride with a thickness that is greater than half of the first separation distance and less than half of the second separation distance;

etching the layer of titanium nitride by at least the thickness in a vertical direction orthogonal to the substrate;

depositing an alternating stack of conducting layers and dielectric layers above the set of vertical TFTs;

etching a plurality of memory holes extending through the alternating stack of conducting layers and dielectric layers;

depositing one or more memory element layers within the plurality of memory holes; and depositing a second conducting material within the plurality of memory holes.

13. The method of claim 12, wherein:

the set of vertical TFTs includes a fourth TFT spaced apart from the third TFT by the first separation distance.

14. The method of claim 12, wherein:

the etching the layer of titanium nitride by at least the thickness in the vertical direction comprises performing a timed anisotropic etch.

15. The method of claim 12, wherein:

the alternating stack of conducting layers and dielectric layers corresponds with a word line stack.

16. The method of claim 12, wherein:

the alternating stack of conducting layers and dielectric layers comprises an alternating stack of polysilicon layers and oxide layers.

17. The method of claim 12, wherein:

the second conducting material comprises tungsten.

18. The method of claim 12, wherein:

the one or more memory element layers includes a layer of titanium oxide.

19. The method of claim 12, wherein:

the one or more memory element layers includes at least one ReRAM material.

* * * * *